(12) United States Patent
Awata et al.

(10) Patent No.: US 7,946,247 B2
(45) Date of Patent: May 24, 2011

(54) COATING LAYER THICKNESS MEASUREMENT MECHANISM AND COATING LAYER FORMING APPARATUS USING THE SAME

(75) Inventors: Hideaki Awata, Itami (JP); Katsuji Emura, Itami (JP); Kentaro Yoshida, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 1050 days.

(21) Appl. No.: 11/797,796

(22) Filed: May 8, 2007

(65) Prior Publication Data

US 2007/0261638 A1    Nov. 15, 2007

(30) Foreign Application Priority Data

May 10, 2006    (JP) ................................ 2006-130924

(51) Int. Cl.
 *B05C 5/02*    (2006.01)
(52) U.S. Cl. ........ 118/663; 118/664; 118/688; 118/691; 118/712; 118/718; 118/33; 118/50; 73/159
(58) Field of Classification Search ..................... 118/50, 118/663, 664, 688, 691, 712, 33, 718; 427/9, 427/10; 73/159; 356/630; 324/229, 230
See application file for complete search history.

(56) References Cited

U.S. PATENT DOCUMENTS

| | | | | |
|---|---|---|---|---|
| 5,224,441 A | * | 7/1993 | Felts et al. | 118/718 |
| 5,948,166 A | * | 9/1999 | David et al. | 118/718 |
| 6,120,833 A | * | 9/2000 | Bonnebat et al. | 427/10 |

FOREIGN PATENT DOCUMENTS

| | | |
|---|---|---|
| JP | 61-264514 A | 11/1986 |
| JP | 61-278032 A | 12/1986 |
| JP | 62-247073 A | 10/1987 |
| JP | 05-116824 | 5/1993 |
| JP | 6-201313 | 7/1994 |
| JP | 7-280503 A | 10/1995 |
| JP | 10-318957 | 12/1998 |
| JP | 2922376 B2 | 4/1999 |
| JP | 2004-12435 A | 1/2004 |

OTHER PUBLICATIONS

Chinese Office Action, with English Translation, issued in Chinese Patent Application No. 2007101032550, mailed Dec. 18, 2009.

* cited by examiner

*Primary Examiner* — Laura Edwards
(74) *Attorney, Agent, or Firm* — McDermott Will & Emery LLP

(57) ABSTRACT

In a measurement mechanism for continuously measuring a thickness of a coating layer, provided in an apparatus for forming the coating layer on a conductive elongate base material in a coating treatment base station while the base material is fed, a sensing portion for measuring a capacitance value of the coating layer is arranged before and after the base station, and tension applied to the base material at the sensing portion is set to be greater than tension applied to the base material at the base station. Thus, in forming the coating layer on the elongate base material while the base material is continuously fed, variation in a feeding speed is suppressed, influence of sway of a measurement surface in a direction of thickness at the thickness sensing portion during feeding is minimized, and a thickness of the coating layer can be measured with higher accuracy.

5 Claims, 2 Drawing Sheets

COATING LAYER THICKNESS MEASUREMENT MECHANISM AND COATING LAYER FORMING APPARATUS USING THE SAME

BACKGROUND OF THE INVENTION

1. Field of the Invention

The present invention relates to a thickness measurement mechanism and a coating layer forming apparatus using the same, for forming a coating layer in a prescribed thickness range on an elongate base material while it is fed.

2. Description of the Background Art

A feeding mechanism provided with a treatment base station (hereinafter, simply also referred to as a base station) for forming a coating layer on a base material surface continuously at a prescribed speed by using physical or chemical means while conductive elongate base materials of various cross-sectional shapes are fed is used for forming a layer to a thickness in a prescribed range over the entire length of the base materials. Here, examples of the base material include various materials ranging from a soft material such as copper, aluminum, or resin containing metal filler to a hard material such as tungsten or steel. In such a feeding mechanism, it is necessary at least at the base station to keep constant the speed of passage of the base material. Therefore, it is necessary to apply appropriate tension to the base material before and after it passes through the base station, and to feed the base material along the same path over the entire length. In the base station, as the tension is applied to the fed base material, friction due to sliding contact between the base material and a feeding member or a member for providing a function is caused, and frictional force greater than that between the base material and the feeding member on a supply side or on a recovery side is applied to the base material.

Among others, it is difficult to adjust the balance of feeding tension when a thin layer is to be formed with high dimensional accuracy on the surface of the elongate base material in the form of a tape or fiber. A so-called winding type thin film forming apparatus, in which an elongate strip-shaped base material (hereinafter simply also referred to as a tape) is fed into a thin film forming chamber and the film is continuously formed on the base material, is widely used for manufacturing various tapes including tapes for magnetic recording, printers and wrapping. Normally, the base material is fed using a feeding member such as rollers provided at a portion for supply to the base station and a portion for recovery from the base station, while the base material is kept in touch with constant tension on the surface of the feeding member. Here, conventionally, there have been problems of the degree of close contact between the tape and the feeding member surface, variation in thickness in the formed layer resulting from fluctuation in feeding speed and damage to the layer surface, and measures to avoid such problems have been considered.

Such measures include (1) those related to a feeding mechanism with attention being paid to a structure or arrangement of a feeding member for supplying or recovering the base material, and (2) those for continuously sensing thickness information calculated in accordance with a surface state or a physical property of a layer and feeding back the information to the feeding member or a manufacturing parameter system affecting the thickness.

For example, Japanese Patent Laying-Open Nos. 62-247073, 61-264514, and 61-278032 propose exemplary means as defined in (1). These publications all propose approaches to suppress variation in the degree of close contact of the tape to the surface of the feeding member such as rollers above. Japanese Patent Laying-Open No. 62-247073 proposes a feeding mechanism where a speed-variable sub-roller is provided before and after the base station, Japanese Patent Laying-Open No. 61-264514 proposes a feeding mechanism where a dancer roller is provided before and after the base station, and Japanese Patent Laying-Open No. 61-278032 proposes a feeding mechanism where a plurality of guide roller pairs are provided on the recovery side. These means, however, cannot be free from variation in thickness of the layer or occurrence of damage, as the speed of the base material is varied due to change over time in an outer diameter of a feeding portion on the supply side and on the recovery side.

A large number of means as defined in (2) utilize relation between a capacitance and a thickness. For example, Japanese Patent No. 2922376 and Japanese Patent Laying-Open Nos. 7-280503 and 2004-12435 present exemplary means. Japanese Patent No. 2922376 discloses means for measuring a thickness using a capacitance and an electric resistance of a sheet. With this means, however, in particular, when a layer has a specific resistance value (electric resistance specific to a material) not smaller than that of a semiconductor, in particular, not smaller than 100 k$\Omega$·cm, dependency of the layer thickness on the electric resistance is lowered, and accuracy in measurement is lowered. Japanese Patent Laying-Open No. 7-280503 discloses means for shaping a contact electrode sensing a capacitance in a rotatable cylinder. With this means, however, in particular, it is difficult for rotation of the electrode to follow unevenness of the layer surface, and accuracy in measurement is lowered. According to Japanese Patent Laying-Open No. 2004-12435, initially, a position of a base material surface or a formed layer surface is measured using a displacement gauge. Then, the measured position and a sensor are set to be equidistant, and the formed layer and the sensor are set in a non-contact state. Then, a capacitance between the base material and the sensor is measured. Thereafter, a thickness is calculated based on correlation between the capacitance and the thickness of the formed layer that have been found in advance. With this means, however, particularly if uneven base material surface is moving, the displacement gauge cannot immediately follow the movement. Accordingly, time lag from sensing of a distance by the sensor is caused, which leads to lower accuracy in measurement. Therefore, if the base material is out of a limited range of base material conditions, variation in thickness of the layer or occurrence of damage is unavoidable.

SUMMARY OF THE INVENTION

In order to suppress such conventional problems as described above, an object of the present invention is to provide a mechanism capable of measuring a thickness of a coating layer with higher accuracy by suppressing variation in a speed of feeding a base material in a treatment portion and minimizing influence of sway of a measurement surface in a direction of thickness at a thickness sensing portion during feeding, as well as a coating layer forming apparatus using the same.

The present invention is directed to a measurement mechanism for continuously measuring a thickness of a coating layer, provided in an apparatus for forming the coating layer on a conductive elongate base material in a coating treatment base station while the base material is fed. In the measurement mechanism, a sensing portion for measuring a capacitance value of the coating layer is arranged before and after the base station, and tension applied to the base material at the sensing portion is set to be greater than tension applied to the base material at the base station. According to the present invention, preferably, the tension applied to the base material at the sensing portion is controlled in a range from 7 to 400 MPa, and the base material has a surface roughness expressed in Ra, in a range from 0.1 to 2 μm.

The present invention also encompasses a coating layer forming apparatus using the measurement mechanism described above. In addition, in order to enhance reliability of a measured thickness value, the present invention also encompasses, as an embodiment where the coating treatment base station and the sensing portion are placed in a vacuum chamber as in a vacuum evaporator, improvement in an electric connection path connecting the sensing portion and an electric control system located outside the chamber to each other, as follows. Specifically, in the coating layer forming apparatus, a field through portion (relaying point) is provided in a partition wall of the chamber, and when connection to an electric control unit is established through an electric connection portion (such as a coaxial cable), characteristic impedances of the field through portion and the connection portion match with each other.

Moreover, the present invention also encompasses the coating layer forming apparatus in which information resulted from comparison between the thickness of the coating layer measured by the measurement mechanism described above and a thickness control range recorded in the measurement mechanism is fed back to a system for controlling a manufacturing parameter for forming the layer in the base station so that the thickness is controlled within a desired range.

The measurement mechanism according to the present invention is suitably used in forming the coating layer on the conductive elongate base material in the coating treatment base station while the base material is fed, and by increasing tension only in the vicinity of the sensing portion, influence during sensing, of sway of the measurement surface of the coating layer caused by feeding can be minimized. Therefore, the thickness of the coating layer can be measured with higher accuracy. In addition, as the tension is applied at the sensing portion before and after the base station, the speed of feeding the base material in the base station can more reliably be controlled within the desired range, and chances of damage of the layer due to change in the speed or the like can also be suppressed further, as compared with the conventional example. Thus, as reliability of thickness data obtained in the sensing portion is improved by using the measurement mechanism according to the present invention, not only variation in the speed of forming the coating layer can be suppressed by controlling the feeding speed in the base station as above, but also a coated material smaller in variation in the thickness in a direction of length can be obtained by feedback of the data to a system for controlling a manufacturing parameter for forming the layer, such as a temperature of the base station.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
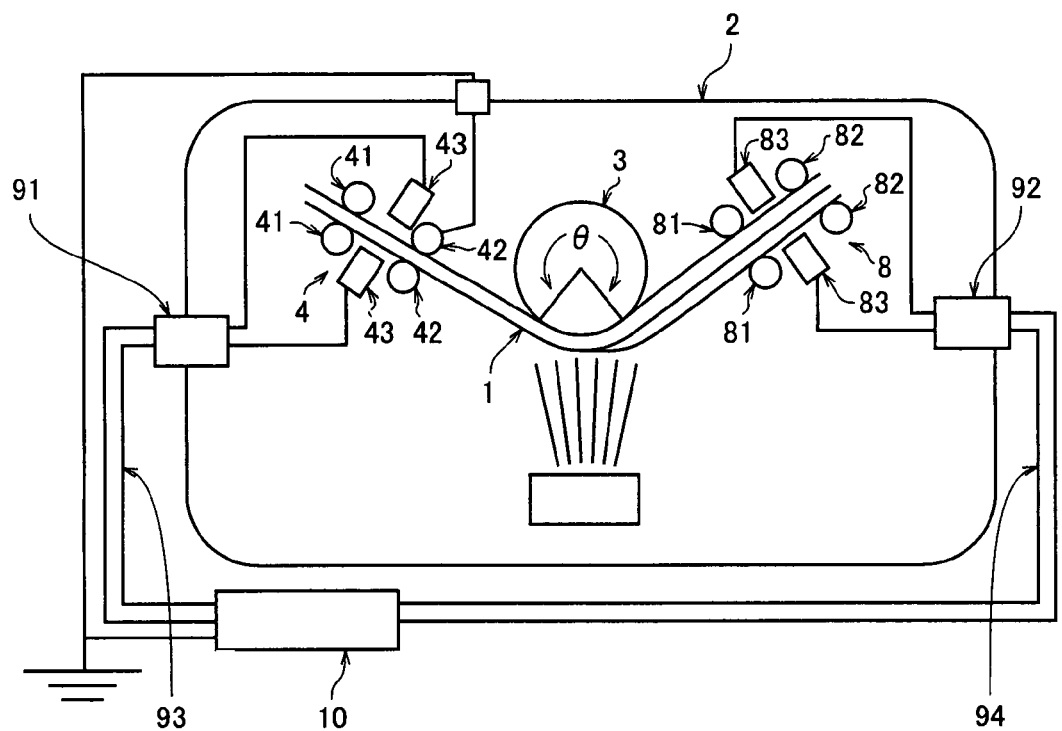
FIG. 1 schematically shows a vacuum vapor-deposition coating treatment apparatus including a mechanism for measuring a thickness of a base material according to an embodiment of the present invention.

The present invention relates to a measurement mechanism measuring, continuously and with high accuracy, a thickness of a coating layer formed on a conductive elongate base material, having a dielectric constant and an electric resistance in a prescribed range, and having a prescribed surface state such as irregularities, while the base material is fed with tension not too excessive for the base material being applied thereto. In the thickness measurement mechanism according to the present invention, the sensing portion is arranged before and after the coating treatment base station. The sensing portion is of a type sensing with a capacitance sensor, and tension applied to the base material at the sensing portion is greater than that applied to the base material in the base station. It is noted that tension applied to the base material in the present invention can be measured by detecting torque applied to a roller.

In forming a prescribed coating layer on the surface of the base material while it is fed, quality of the coating layer is varied depending on change in an environment of the base station where the coating layer is formed or in the feeding speed of the feeding member. In the coating apparatus employing the measurement mechanism according to the present invention, initially, the speed of feeding the base material in the base station that affects variation in the quality such as thickness in the direction of length of the base material should be suppressed within a certain range. Accordingly, feeding stroke of the feeding member in the base station should be adjusted, taking into account unbalance in tension between base material supply side and recovery side with lapse of time. Therefore, prescribed rotation torque is applied to the feeding member such as a roller. Specifically, by using a torque motor or the like, the feeding member is controlled such that tension $T_1$ of force in a direction opposite to the feeding direction is applied at the supply side and tension $T_2$ of force in the feeding direction smaller than $T_1$ is applied at the recovery side. As moderate tension is thus applied to the base material, the base material can be fed in close contact with the feeding member such as a roller. As a result of frictional force up to maximum frictional force F between the base station and the base material, the base material is moved in the feeding direction. As described previously, in order to maintain the treatment in a steady state, control is constantly carried out such that relation of $F>T_1>T_2$ is satisfied.

The measurement mechanism according to the present invention is configured to sense, with higher reliability and with smaller variation, capacitance values before and after formation of the coating layer by using the sensing portion located before and after the base station, and to calculate the thickness of the layer based on the difference, while the base material is fed at a constant speed with relation in tension as above being maintained. As described above, if the base material is fed at a controlled speed within a prescribed range, accuracy in measurement can be ensured to some degree. Nevertheless, some sway of the surface of the layer or of the base material to be fed occurs. Therefore, in order to conduct measurement with higher accuracy, such sway should be minimized.

According to the measurement mechanism of the present invention, in forming the coating layer on the conductive elongate base material in the coating treatment base station while the base material is fed, the capacitance value of that layer is measured with tension being increased only in the vicinity of the sensing portion, so that influence of sway of the base material measurement surface caused by feeding in measuring the measurement value of the coating layer is minimized. The thickness of the coating layer can thus be measured with higher accuracy. As to means for applying tension only around the sensing portion, for example in a roller type feeding mechanism, a pinch roller should only be arranged immediately before and after the sensing portion. Alternatively, for example in a belt type feeding mechanism as well, a pinch roller should only be arranged under the belt. In addition, as tension is applied at the sensing portion before and after the base station, the speed of feeding the base material in the base station can more reliably be controlled within the desired range, and chances of damage of the layer due to change in the speed or the like can also be suppressed further, as compared with the conventional example. Thus, reliability of physical property values measured in the sensing portion is improved by employing the measurement mechanism according to the present invention, and consequently, reliability of the obtained thickness data is improved. Therefore, not only a feeding speed in the base station described above is controlled but also the data is fed back to a system for controlling a manufacturing parameter for forming the layer, such as a temperature of an evaporation source in the base station, thereby obtaining a coated material having smaller variation in thickness in the direction of length.

Appropriate tension to be applied to the conductive base material at the sensing portion varies, depending mainly on hardness of a material for the base material. Here, the tension is desirably in a range from 7 to 400 MPa, for materials ranging from a soft material such as copper, aluminum, or resin containing metal filler to a hard material such as tungsten or steel. If the tension is smaller than the lower limit, it is difficult to suppress sway in the direction of thickness of the base material (such as sway in the direction of thickness due to feeding of the base material and sway due to irregularities on the surface of the formed layer), and such sway tends to affect sensing data. On the other hand, if the tension exceeds the upper limit, such tension is excessive for soft base materials, and depending on the environment of the base station (for example, when the temperature of the base station is higher than that of the sensing portion), fluctuation in the thickness of the base material may be caused. More preferably, the tension is in a range from 50 to 300 MPa.

Though not much affected by normal irregularities on a base material or a layer (irregularities in a range approximately from 0.01 to 10 μm when expressed in surface roughness Ra), measurement accuracy of the measurement mechanism according to the present invention is desirably in a range from 0.1 to 2 μm when expressed in Ra. Particularly, if Ra is not smaller than 0.5 μm, measurement with accuracy higher than with conventional sensing means where tension is not applied around the sensing portion can be realized. According to the measurement mechanism of the present invention above, even if the coating layer has a specific electric resistance value not smaller than 100 kΩ·cm, excellent accuracy can be obtained. For example, where the thickness of the layer is measured based on an electric resistance as in Japanese Patent No. 2922376, in the coating layer made of a material having specific resistance at this level, a contact resistance value irrelevant to thickness is also increased if the base material sways during feeding. Accordingly, conversion as a whole from measured bulk electric resistance values to thickness with high accuracy is difficult. According to the measurement mechanism of the present invention, as the thickness of the layer is measured based on the capacitance, the value of the specific electric resistance does not affect measurement.

According to the measurement mechanism of the present invention described above, as the thickness data of high measurement accuracy can be obtained, the measurement mechanism is suitable as manufacturing means for forming the coating layer on the elongate base material while it is fed, and the measurement mechanism can be used in every coating layer forming apparatus to which such measurement principles are applicable. In addition, a speed change phenomenon in the base station is less likely, and chances of damage of the coated material can also be suppressed, as compared with the conventional example. Thus, as described previously, reliability of the thickness data obtained in the sensing portion is enhanced, and as will be described below, the data is fed back to the system for controlling a manufacturing parameter for forming the layer, such as a temperature of the base station, thereby obtaining a coated material having smaller variation in thickness in the direction of length.

An exemplary coating layer forming apparatus including the measurement mechanism according to the present invention is an apparatus provided with the base station and the sensing portion in the vacuum chamber, like a vacuum evaporator. Here, the electric control unit for the sensing portion is normally placed outside the vacuum chamber, and the electric control unit is connected via the field through portion (relaying point) provided in the partition wall of the vacuum chamber through the electric connection portion such as a coaxial cable. In such a case, in the coating layer forming apparatus, characteristic impedances of the connection portion and the field through portion match with each other. Thus, the thickness data of high measurement accuracy that is obtained in the sensing portion is transmitted, without being modified by the control unit.

Another exemplary coating layer forming apparatus including the measurement mechanism according to the present invention is a forming apparatus configured to transmit the obtained measurement data to the control unit, to compare the measurement data with the information prepared in advance for setting a thickness in a desired range, and to feed back manufacturing parameter control information to the control system in the base station. Thus, the coating layer of which variation in thickness is suppressed within a desired range can readily be formed over the entire length of the base material. In the following, the present invention will be described with reference to examples, while the invention is not limited to the contents below.

FIRST EXAMPLE

Formation of Si Vapor-Deposited Layer on Metal Foil Tape

Referring to FIG. 1, a base material 1 formed as a conductive film is fed from a supply side roller (not shown) placed outside a vacuum chamber 2 on the right in the drawing to a roller 3 in the treatment base station placed inside the vacuum chamber, and an Si vapor-deposited layer or the like is formed on the surface thereof. Thereafter, base material 1 is wound and recovered by a recovery side roller (not shown) placed outside the vacuum chamber on the left in the drawing. The supply side roller is driven, for example, by a motor through an electromagnetic torque control mechanism, and set to transmit tension $T_1$ of force in the direction opposite to the feeding direction to base material 1. On the other hand, the recovery side roller is driven by a motor through an electromagnetic torque control mechanism, and set to transmit tension $T_2$ of force in the feeding direction to base material 1. Roller 3 at the treatment base station is set to control the difference in tensions constantly in an appropriate range, by means of a servo motor (not shown). If coating treatment is performed with a contact angle of base material 1 to the roller (central angle corresponding to the outer circumference where the base material is in sliding contact with the roller, indicated by θ in the figure) being set, a guide roller or the like is arranged outside the section between the two sensing portions as appropriate. In the present embodiment, the guide rollers (not shown) are provided on the supply side and the recovery side outside the vacuum chamber, such that the contact angle of the tape to the roller is set to approximately 220°.

Tension $T_3$ of tensile stress is applied to supplied base material 1 at sensing portion 4, namely, only in a section between two pairs of pinch rollers 41 and 42, by these pinch rollers, before base material 1 reaches roller 3 in the base station, and a thickness $t_1$ is measured by a pair of capacitance-type displacement gauges (capacitance sensors) 43. Base material 1 having the layer formed thereon passes roller 3 in the base station, and thereafter, tension $T_3$ is applied to base material 1 at sensing portion 8, namely, only in a section between two pairs of pinch rollers 81 and 82, by these pinch rollers, and a thickness $t_2$ is measured by a pair of capacitance-type displacement gauges (capacitance sensors) 83. Thicknesses $t_1$ and $t_2$ measured by these displacement gauges (hereinafter, simply also referred to as sensors) are transmitted to a controller 10 through a field through (relaying point) 91, 92 provided in the wall of the vacuum chamber and electric connection portion 93, 94 formed by a coaxial cable, so that the thickness $(t_2-t_1)$ of the continuously formed coating layer is calculated. It is noted that the characteristic impedances of the relaying point and the coaxial cable match at 50Ω.

Until feeding of the entire length ends, the outer diameter of the wound base material continuously decreases on the supply side and continuously increases on the recovery side, and therefore, compensation with time is necessary to lessen resultant variation in quality of the vapor-deposited layer. It is also necessary to determine appropriate range of rotation speed of roller 3 in view of ensured quality in vapor deposition such as cooling capacity of roller 3, minimum necessary time of vapor deposition, and tolerable range of frictional load not excessive to base material 1. From the foregoing, programming was carried out in advance, including torque control and servo control levels. As a result, the speed of rotation of roller 3 at the vapor deposition base station was set to 0.2 RPM (rotations per minute, equivalent to feeding speed of 100 m/min), and tensile loads corresponding to tensions $T_1$ and $T_2$ were set to 168 g (initial) to 210 g (final) for the former, and 125 g (initial) to 100 g (final) for the latter, respectively.

Figure 2:
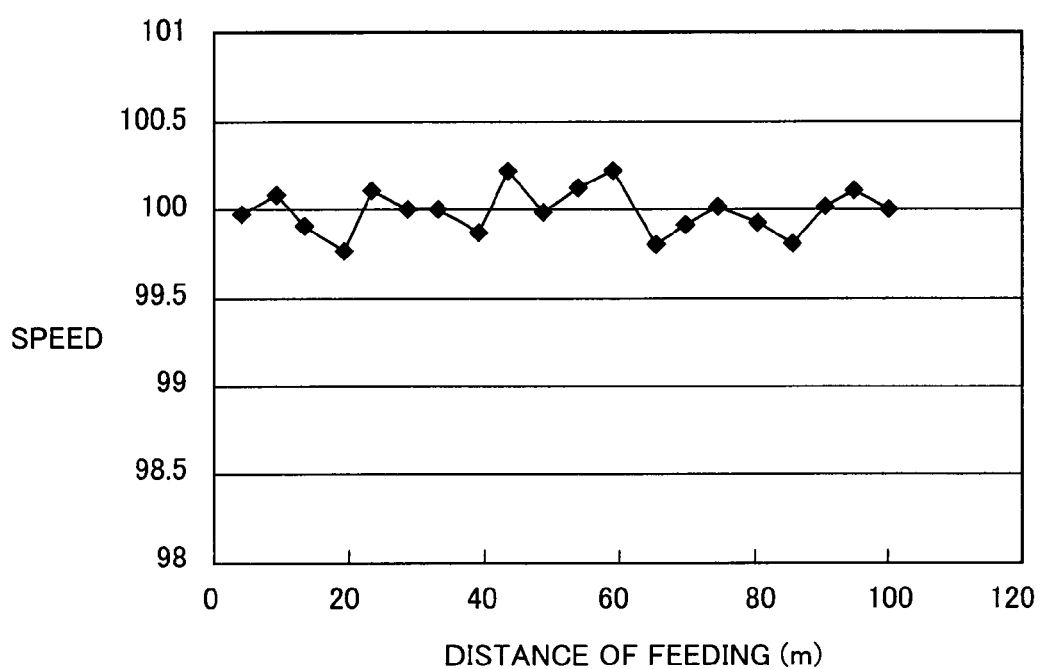
FIG. 2 illustrates exemplary correlation between a distance of feeding and a speed of feeding the base material in the embodiment of the present invention.
Figure 3:
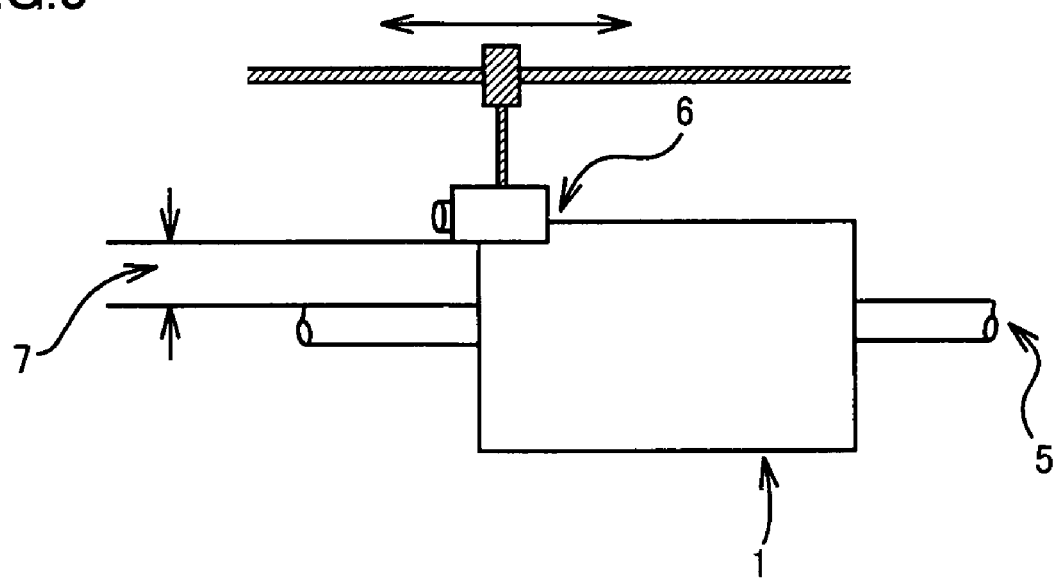
FIG. 3 schematically shows an example of continuous monitoring means for monitoring an outer diameter of wound base material in a base material feeding mechanism in the embodiment of the present invention.

The outer diameter of the roller around which the base material was wound was measured by processing an image picked up by a CCD camera. Specifically, as shown in FIG. 3, a CCD camera 6 moves in the radial direction to sense the outermost circumference based on contrast, then moves in the axial direction to sense the outer circumference of an exposed core 5 in the similar manner, and measures an outer diameter 7 based on the difference in coordinates of the two. Torque motor output was controlled such that a product of measured outer diameter 7 and the torque motor output attains to a predetermined value. It is noted that the base material and the formed layer were free of any scratch caused by sticking or stretch. As to the tape feeding speed, a detection roller was brought into contact with the base material surface on the recovery side, feeding distance was measured by an attached rotary encoder, and with an operation of a timer, the speed was intermittently measured. The results are as shown in FIG. 2.

Using the vapor deposition apparatus having sensing portion 4, 8 and the feeding mechanism as above, a silicon (Si) source evaporated through electron beam irradiation was deposited on various base material surfaces on roller 3 containing a cooling chamber through which a coolant passes, thereby vapor-depositing the silicon layer serving as a coating. Here, based on the contact area of base material 1 estimated from the contact angle of the tape to roller 3 described previously, coefficient of friction between base material 1 and roller 3 found beforehand in an experiment and the supply side and recovery side tensions, frictional load of 300 g between base material 1 and the roller in the treatment base station was found. This represents the load of the level that does not cause any damage to base material 1 resulting from stretch of base material 1 itself.

Base materials 1 shown in the field of "conductive base material" in Table 1 were prepared. The widths of base materials 1 were all set to 130 mm and the entire lengths thereof were set to 500 m. "Cu", "A", "SUS", and "Mo" in the field of material represent pure copper, pure aluminum, 18-8 stainless steel, and pure molybdenum, respectively. Base material 1 has a surface roughness expressed in Ra value, which is found under JIS B 0601-1994. Tension $T_3$ applied by pinch rollers 41, 42, 81, 82 at sensing portion 4, 8 immediately before and after the base station is as shown in the table.

TABLE 1

| | Conductive Base Material | | | | Coating Layer | | | |
| | | | | | Measured Thickness Value | | Actually Measured Thickness Value | |
| Sample Number | Material | Thickness (μm) | Surface Roughness Ra (μm) | Tension $T_3$ at Sensing Portion (MPa) | Material | Average Value (μm) | Variation (μm) | Average Value (μm) | Variation (μm) |
|---|---|---|---|---|---|---|---|---|---|
| 1 | Cu | 5 | 1 | 200 | Si | 5.00 | 0.25 | 5.00 | 0.23 |
| 2 | Cu | 10 | 1 | 200 | Si | 5.00 | 0.15 | 5.00 | 0.13 |
| 3 | Cu | 30 | 1 | 200 | Si | 5.00 | 0.15 | 5.00 | 0.13 |
| 4 | Cu | 50 | 1 | 200 | Si | 5.00 | 0.15 | 5.00 | 0.13 |
| 5 | Al | 10 | 1 | 200 | Si | 5.00 | 0.15 | 5.00 | 0.14 |
| 6 | SUS | 10 | 1 | 200 | Si | 5.00 | 0.15 | 5.00 | 0.13 |

TABLE 1-continued

|  | Conductive Base Material | | | | Coating Layer | | | |
|---|---|---|---|---|---|---|---|---|
|  |  |  |  |  |  | Measured Thickness Value | | Actually Measured Thickness Value | |
| Sample Number | Material | Thickness (μm) | Surface Roughness Ra (μm) | Tension $T_3$ at Sensing Portion (MPa) | Material | Average Value (μm) | Variation (μm) | Average Value (μm) | Variation (μm) |
| 7 | Mo | 10 | 1 | 200 | Si | 5.00 | 0.19 | 5.00 | 0.17 |
| *8 | Cu | 10 | 1 | 0.5 | Si | 5.00 | 0.40 | 5.00 | 0.15 |
| 9 | Cu | 10 | 1 | 5 | Si | 5.00 | 0.27 | 5.00 | 0.25 |
| 10 | Cu | 10 | 1 | 7 | Si | 5.00 | 0.25 | 5.00 | 0.23 |
| 11 | Cu | 10 | 1 | 20 | Si | 5.00 | 0.20 | 5.00 | 0.18 |
| 12 | Cu | 10 | 1 | 50 | Si | 5.00 | 0.14 | 5.00 | 0.13 |
| 13 | Cu | 10 | 1 | 100 | Si | 5.00 | 0.13 | 5.00 | 0.12 |
| 14 | Cu | 10 | 1 | 300 | Si | 5.00 | 0.13 | 5.00 | 0.12 |
| 15 | Cu | 10 | 1 | 400 | Si | 5.00 | 0.20 | 5.00 | 0.18 |
| 16 | Cu | 10 | 1 | 500 | Si | 5.00 | 0.25 | 5.00 | 0.23 |
| 17 | Mo | 10 | 1 | 20 | Si | 5.00 | 0.24 | 5.00 | 0.20 |
| 18 | Cu | 10 | 0.05 | 200 | Si | 5.00 | 0.24 | 5.00 | 0.20 |
| 19 | Cu | 10 | 0.1 | 200 | Si | 5.00 | 0.16 | 5.00 | 0.14 |
| 20 | Cu | 10 | 0.5 | 200 | Si | 5.00 | 0.13 | 5.00 | 0.11 |
| 21 | Cu | 10 | 2 | 200 | Si | 5.00 | 0.13 | 5.00 | 0.12 |
| 22 | Cu | 10 | 2.5 | 200 | Si | 5.00 | 0.17 | 5.00 | 0.15 |
| 23 | Cu | 10 | 5 | 200 | Si | 5.00 | 0.20 | 5.00 | 0.17 |

By thus fabricating samples under the conditions shown in Table 1, the thickness of the coating layer was continuously calculated, measured, and recorded, based on the film thickness data obtained by the sensor in sensing portion 4, 8 before and after the base station. In the field of "measured thickness value" in the table, average values of thicknesses extracted at 30 points at regular intervals in the direction of length of base material 1 from the continuously measured data (arithmetic mean values obtained by dividing the total sum of data by 30) and variations therein (30 standard deviations) are shown. In addition, in the field of "variation in actually measured thickness values" in the table, variations (30 standard deviations) obtained by precisely measuring the thicknesses at actual sample points corresponding to the respective 30 points are shown. The thickness was precisely measured in the following manner. Each point was punched through by using a mold having a prescribed area A, the punched portion was dissolved in a solvent, a coated amount was determined through induced plasma emission spectroscopy, a volume V was calculated by conversion from density, and conversion to thickness in a corresponding amount was carried out by calculating V/A. It is noted that representation "Si" as the material in the field of "coating layer" in Table 1 represents silicon.

Based on the results, the following can be found. (1) In sample 8, the measurement mechanism according to the present invention was not provided. As can clearly seen from the data, variation in measurement values is greater than variation in actually measured values (true values), and variation accounts for 8% of the average value. This is because, sway of base material 1 at sensing portion 4, 8 was not suppressed and influence thereof was exhibited. In contrast, variation in measurement values in other samples according to the present invention is suppressed below 6% of the average value, and difference from corresponding variation in actually measured values (variation in true values) is decreased. As can be seen from this result, reliability of measurement values according to the present invention is higher than that of the conventional measurement values without employing the measurement mechanism. (2) By setting tension $T_3$ at the sensing portion to a value in a range from 7 to 400 MPa, variation in measurement values can be suppressed to at most 5% relative to average value of 5 μm. In addition, by setting tension $T_3$ at the sensing portion to a value in a range from 50 to 300 MPa, variation in measurement values can be suppressed to at most 4% relative to average value of 5 μm. (3) Moreover, when base material 1 has surface roughness Ra in a range from 0.1 to 2 μm, variation in measurement values according to the measurement mechanism of the present invention is suppressed to 4% at the maximum, and there is almost no difference from the variation in actually measured values (variation in true values). (4) The results above are reproduced in base material 1 having different hardness or in base material 1 having a different thickness in a normal range.

SECOND EXAMPLE

Formation of Various Vapor-Deposited Layers on Metal Foil Tape and Feedback of Measurement Value to Manufacturing System Base Material 1, that is Formed as Pure Copper Foil, has a Width of 130 mm, a thickness of 10 μm, a length of 500 m, and surface roughness Ra of 2 μm, and was used in the first example, was prepared. The conditions substantially the same as in the first example were set, tension $T_3$ to be applied at sensing portion 4, 8 was set to 200 MPa, and layers of various materials shown in the field of material for "coating layer" in Table 2 were vapor-deposited on the base material surface to an average thickness of approximately 5 μm.

If the specific resistance of the material is greater than a specific resistance of a semiconductor region, change in capacitance ΔC (ΔC/Δρ) due to change in specific resistance Δρ becomes smaller, and change in thickness value Δt measured by the capacitance-type sensor also becomes smaller. Therefore, according to the measurement mechanism of the present invention, though variation in thickness t due to sway of base material 1 is suppressed, reliability of the actually measured values is lowered. In order to solve this problem, in the measurement mechanism of the present example, (a) a program for calibrating a measured thickness based on correlation between the specific resistance and the capacitance (ΔC/Δρ) for each material for the coating layer was added to an operation circuit.

Meanwhile, a temperature characteristic of base material 1 is different depending on the materials and the measurement value may be affected by the temperature at sensing portion 4, 8. Accordingly, the temperature of base material 1 at sensing portion 4, 8 was actually measured by placing a thermocouple in the vicinity, and controller 10 was programmed such that the operation circuit can correct the measured thickness value of the coating layer to a value at room temperature. In the present example, in addition, (b) the thickness data calibrated and corrected as described above is fed back to controller 10 of a relevant base station, where the thickness data is constantly compared with the desired thickness range of base material 1 so that the difference is suppressed within a certain deviation range. In the present example, based on the deviation obtained from comparison between the thickness data value calibrated and corrected and a median in the desired thickness range, the temperature of the evaporation source of the vapor-deposition source was controlled. "Measured thickness value 1" and "measured thickness value 2" in Table 2 represent results obtained by conducting experiments in accordance with conditions (a) and (b) respectively. It is noted that "actually measured thickness value" was measured in a procedure the same as in the first example.

Those shown in the field of material for "coating layer" in Table 2 were prepared as raw materials for the coating layer. "TN", "VO", "SO", and "AO" shown represent a titanium-nitride-based material (having specific resistance at room temperature of 13 Ω·cm), a vanadium-pentoxide-based material (having specific resistance at room temperature of 550 Ω·cm), a tin-oxide-based material (having specific resistance at room temperature of $1.5 \times 10^9$ Ω·cm), and an aluminum-oxide-based material (having specific resistance at room temperature of $3 \times 10^{15}$ Ω·cm), respectively. Sample numbers 36 and 37 refer to samples coated with silicon (Si, having specific resistance at room temperature of $2.3 \times 10^5$ Ω·cm), similar to samples 2 and 8 in the first example, respectively. Evaporation source and atmosphere in the chamber for forming the coating layer were as follows: titanium nitride was obtained as a result of evaporation of titanium in nitrogen; vanadium pentoxide was obtained as a result of evaporation of vanadium in an oxygen atmosphere; tin oxide was obtained as a result of evaporation of tin in an oxygen atmosphere; aluminum oxide was obtained as a result of evaporation of aluminum in an oxygen atmosphere; and silicon was obtained as a result of evaporation in vacuum.

The results are as shown in Table 2. It is noted that the upper and intermediate rows represent the results obtained when pinch rollers 41, 42, 81, and 82 were provided at sensing portion 4, 8 and tension 200 MPa was applied to base material 1, and the lower row represents the results in comparative examples where pinch rollers 41, 42, 81, and 82 were removed and no additional tension was applied to base material 1 at sensing portion 4, 8, for each material. Though not shown in Table 2, in accordance with condition (b) above, calibrated thickness data was fed back not only to a heater in the evaporation source but also simultaneously to a roller drive portion (each control motor) in the feeding portion, so as to also adjust the feeding speed. Then, in all samples, variation could further be lowered by approximately 10%, as compared with measured thickness value 2.

TABLE 2

| | | | Coating Layer | | | | | |
|---|---|---|---|---|---|---|---|---|
| | | | Measured Thickness Value 1 | | Measured Thickness Value 2 | | Actually Measured Thickness Value | |
| Sample Number | Material | Specific Resistance (Ω·cm) | Average Value (μm) | Variation (μm) | Average Value (μm) | Variation (μm) | Average Value (μm) | Variation (μm) |
| 24 | TN | 13 | 5 | 0.16 | 5 | 0.12 | 5 | 0.10 |
| 25 | TN | 13 | 5 | 0.16 | 5 | — | — | — |
| *26 | TN | 13 | 5 | 0.37 | 5 | 0.30 | 5 | 0.13 |
| 27 | VO | 550 | 5 | 0.17 | 5 | 0.13 | 5 | 0.12 |
| 28 | VO | 550 | 5 | 0.20 | 5 | — | — | — |
| *29 | VO | 550 | 5 | 0.38 | 5 | 0.32 | 5 | 0.14 |
| 30 | SO | $1.5 \times 10^9$ | 5 | 0.18 | 5 | 0.14 | 5 | 0.13 |
| 31 | SO | $1.5 \times 10^9$ | 5 | 0.21 | 5 | — | — | — |
| *32 | SO | $1.5 \times 10^9$ | 5 | 0.39 | 5 | 0.34 | 5 | 0.15 |
| 33 | AO | $3 \times 10^{15}$ | 5 | 0.21 | 5 | 0.16 | 5 | 0.14 |
| 34 | AO | $3 \times 10^{15}$ | 5 | 0.23 | 5 | — | — | — |
| *35 | AO | $3 \times 10^{15}$ | 5 | 0.42 | 5 | 0.36 | 5 | 0.16 |
| 36 | Si | $2.3 \times 10^5$ | 5 | 0.15 | 5 | 0.13 | 5 | 0.13 |
| 37 | Si | $2.3 \times 10^5$ | 5 | 0.20 | 5 | — | — | — |
| *38 | Si | $2.3 \times 10^5$ | 5 | 0.40 | 5 | 0.18 | 5 | 0.15 |

Asterisk * indicates comparative examples.

Based on the results, the following can be found. Initially, as in the first example, (1) variation in the data according to the present invention measured with tension being applied additionally at sensing portion 4, 8 is smaller than variation resulted when the conventional measurement method is used, namely, measurement without applying additional tension, and variation is closer to the actually measured value (true value). Therefore, reliability of the data is high. (2) If means (b) for feeding back the calibrated thickness data to the evaporation source or the feeding drive portion is adopted, as compared with case (a) without adopting such means, variation is closer to the actually measured value and data with higher reliability can be obtained. Namely, measured thickness value 2 is closer to the actually measured value than measured thickness value 1 is, and variation is suppressed.

The measurement mechanism according to the present invention can measure the thickness of the layer continuously and with high accuracy while suppressing sway of the base material caused by feeding, in forming the coating layer on the conductive elongate base material in the coating treatment base station while the base material is fed. As reliability of thickness data obtained in the sensing portion is improved by employing the measurement mechanism according to the present invention, not only variation in the speed of forming the coating layer can be suppressed by controlling the feeding speed in the base station above, but also a coated material smaller in variation in thickness in a direction of length can be obtained by feedback of the data to a system for controlling a manufacturing parameter for forming the layer, such as a temperature of the base station.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A measurement mechanism for continuously measuring a thickness of a coating layer, provided in an apparatus for forming the coating layer on a conductive elongate base material in a coating treatment base station while the base material is fed, the measurement mechanism comprising:
    a sensing portion for measuring a capacitance value of the coating layer, the sensing portion having a first part being arranged before a roller of the base station and a second part arranged after the roller of the base station;
    two pairs of first pinch rollers which sandwich the first part of the sensing portion, the two pairs of first pinch rollers structured to provide a first tension to the base material at the first part of the sensing portion; and
    two pairs of second pinch rollers which sandwich the second part of the sensing portion, the two pairs of second pinch rollers structured to provide a second tension to the base material at the second part of the sensing portion, wherein
    each of the first and second tensions is set to be greater than a tension of the base material at the roller of the base station.

2. The measurement mechanism according to claim 1, wherein
    the two pairs of the first pinch rollers are structured to generate tension applied to said base material between the two pairs of the first pinch rollers in a range from 7 to 400 MPa, and the two pairs of the second pinch rollers are structured to generate tension applied to said base material between the two pairs of the second pinch rollers in a range from 7 to 400 MPa.

3. A coating layer forming apparatus comprising the measurement mechanism according to claim 1.

4. The coating layer forming apparatus according to claim 3, wherein
    said sensing portion and said coating treatment base station are placed in a vacuum chamber, an electric control unit for the sensing portion is placed outside the vacuum chamber, the electric control unit connected to the chamber via a feedthrough portion, the sensing portion and the control unit are connected to each other through an electric connection portion, and impedances of the electric connection portion and the feedthrough portion match with each other.

5. The coating layer forming apparatus according to claim 4, wherein
    information resulted from comparison between the thickness of the coating layer measured by said measurement mechanism and a thickness control range of the coating layer recorded in the measurement mechanism is fed back to a system for controlling a manufacturing parameter for forming the coating layer in the base station so that the thickness is controlled within a desired range.

* * * * *